United States Patent
Haskins et al.

(10) Patent No.: US 7,194,328 B1
(45) Date of Patent: *Mar. 20, 2007

(54) METHOD AND APPARATUS FOR TRACKING RETICLE HISTORY

(75) Inventors: Andrew Haskins, Austin, TX (US); Chunliang Xia, Cedar Park, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/278,589

(22) Filed: Apr. 4, 2006

(51) Int. Cl.
*G06F 19/00* (2006.01)
*G06F 17/30* (2006.01)

(52) U.S. Cl. ............. 700/174; 700/175; 707/104.1
(58) Field of Classification Search ............ 700/95–97, 700/108–110, 115–121, 174, 175; 707/104.1
See application file for complete search history.

(56) References Cited

U.S. PATENT DOCUMENTS

| | | | | |
|---|---|---|---|---|
| 5,625,816 | A | 4/1997 | Burdick et al. | 395/614 |
| 5,889,674 | A | 3/1999 | Burdick et al. | 364/468 |
| 6,599,670 | B2 * | 7/2003 | Ikuno et al. | 430/30 |
| 6,744,266 | B2 * | 6/2004 | Dor et al. | 324/751 |
| 6,759,655 | B2 * | 7/2004 | Nara et al. | 250/310 |
| 6,801,297 | B2 * | 10/2004 | Nakae | 355/40 |
| 6,841,321 | B2 * | 1/2005 | Matsumoto et al. | 430/30 |
| 6,842,230 | B2 * | 1/2005 | Takakuwa et al. | 355/77 |
| 7,058,627 | B2 * | 6/2006 | Wiesler et al. | 707/5 |
| 7,061,600 | B2 * | 6/2006 | Maeda et al. | 356/237.2 |
| 2001/0047222 | A1 * | 11/2001 | Wiesler et al. | 700/214 |
| 2002/0081501 | A1 * | 6/2002 | Hasegawa et al. | 430/5 |
| 2004/0075837 | A1 * | 4/2004 | Maeda et al. | 356/394 |
| 2005/0004774 | A1 * | 1/2005 | Volk et al. | 702/108 |
| 2006/0053219 | A1 * | 3/2006 | Kutsumi et al. | 709/224 |

FOREIGN PATENT DOCUMENTS

JP    2001-006997    *    1/2001

* cited by examiner

*Primary Examiner*—M. N. Von Buhr
(74) *Attorney, Agent, or Firm*—Williams, Morgan & Amerson, P.C.

(57) ABSTRACT

A method includes storing data associated with a plurality of reticles. Reticle history information is received. The reticle history information is linked to a selected reticle. The linked reticle history information is stored. A reticle information system includes a reticle database and a loader. The reticle database is operable to store data associated with a plurality of reticles. The loader is operable to receive reticle history information, link the reticle history information to a selected reticle, and store the linked reticle history information in the reticle database.

25 Claims, 4 Drawing Sheets

METHOD AND APPARATUS FOR TRACKING RETICLE HISTORY

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to semiconductor manufacturing and, more particularly, to a method and apparatus for tracking reticle history.

Manufacturing modern integrated circuit devices requires the performance of many complex processes, such as deposition processes, etching processes, ion implant processes, and photolithography processes. In general, photolithography involves the formation of a patterned layer of photoresist above a previously formed process layer. Ultimately, the underlying process layer will be subjected to one or more etching processes while using the patterned layer of photoresist as a mask. This will result in the selective removal of the portions of the process layer that are not protected by the photoresist masking layer. That is, a plurality of features, e.g., gate electrode structures, metal contacts, etc., will be formed in the underlying process layer. The patterned layer of photoresist is then removed and additional process operations are performed, e.g., additional layers of material are formed and selectively etched, until such time as the integrated circuit device is completed.

Photolithography is one of the most important, expensive and time-consuming processes performed in a modern integrated circuit manufacturing facility. In the photolithography process, a layer of photoresist material (positive or negative) is deposited on a process layer that has been formed above a semiconducting substrate, i.e., a wafer. Thereafter, the layer of photoresist is selectively exposed to a light source. More particularly, during the exposure process, radiant energy, such as ultraviolet light or deep ultraviolet light, is directed through a reticle to selectively expose the layer of photoresist. In this manner, the pattern in the reticle is transferred to the layer of photoresist. The layer of photoresist is then developed to remove the exposed portions of the layer of photoresist (for a positive resist material) to thereby define a patterned photoresist mask that is used in the subsequent etching of the underlying process layer. For negative photoresist materials, the unexposed portions of the layer of photoresist are removed during the development process. Additionally, the layer of photoresist is exposed to the light source on a flash-by-flash basis in a stepper exposure tool. The number of production die in each flash pattern may vary, e.g., a 2×2 pattern (4 die), a 2×4 pattern (8 die), etc. This step-by-step exposure process is continued until all of the areas of the production die on the wafer are exposed.

The manufacture and patterning of a reticle is a very time-consuming and expensive process. A reticle for use in manufacturing a modern integrated circuit product may cost between $25,000–$75,000, depending upon the type of reticle and the complexity of the reticle pattern. A reticle typically includes a transparent substrate comprised of, for example, quartz or glass. A very thin, opaque film is formed above the transparent substrate. The opaque film may be comprised of a variety of materials, such as chromium. To form the pattern in the reticle, a layer of photoresist material, e.g., a positive photoresist material, is formed above the opaque film, and an electron beam is used to expose selected portions of the layer of photoresist. Thereafter, the exposed portions of the layer of positive photoresist are removed, thereby exposing portions of the underlying opaque film, e.g., chromium. An etching process is then performed using the patterned layer of photoresist as a mask to remove the exposed portions of the opaque film, resulting in the desired pattern in the opaque film. The patterned layer of photoresist is then removed, and the reticle is ready for use in the photolithography process as described above.

Typically, a semiconductor manufacturer will provide the desired pattern for the reticle to a vendor that manufactures reticles. The specification documents provided to the vendor specify those features to be manufactured on the reticle that are deemed important by designers. Such features are referred to as target features herein. Generally, the target features represent features that are selected by the device designers for verification. After the manufacture of the reticle, the vendor typically provides a certificate of conformance (CofC) indicating verification tests that were performed to certify that the reticle meets the design requirements with respect to the target features.

Typically, data and requirements associated with the design and fabrication of reticles are not related to the final integrated circuit device. This lack of association between design and production data makes it difficult to evaluate the implementation of the design in the final product, and hence, hampers the ability to implement design changes to improve performance or yield, or to troubleshoot design-induced manufacturing problems.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes storing data associated with a plurality of reticles. Reticle history information is received. The reticle history information is linked to a selected reticle. The linked reticle history information is stored.

Another aspect of the present invention is seen in a reticle information system including a reticle database and a loader. The reticle database is operable to store data associated with a plurality of reticles. The loader is operable to receive reticle history information, link the reticle history information to a selected reticle, and store the linked reticle history information in the reticle database.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
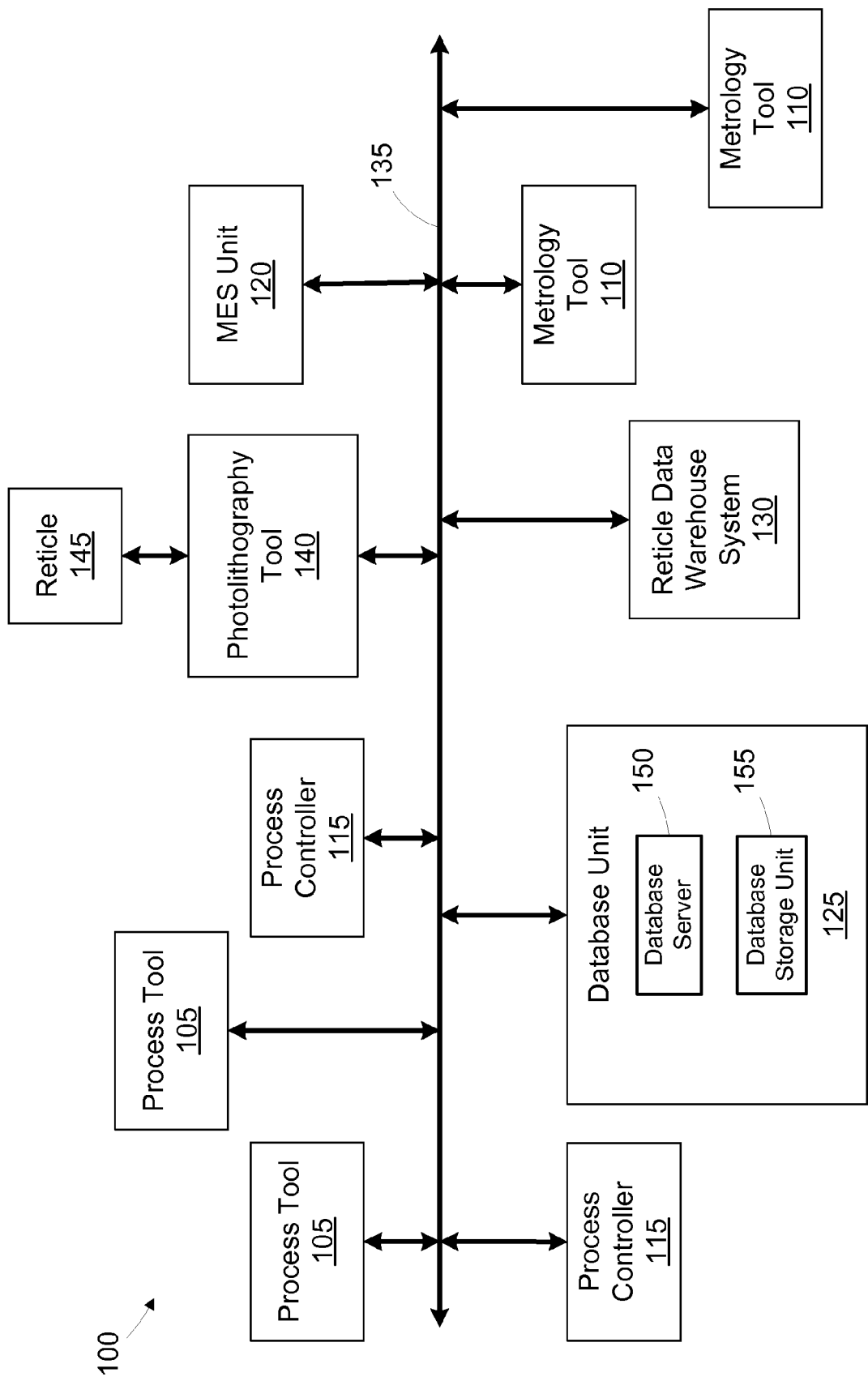
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or CDROM), and may be read only or random access. Similarly, the transmission medium may be twisted wire pairs, coaxial cable, optical fiber, wireless or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present invention shall be described in the context of an illustrative manufacturing system 100. The manufacturing system 100 includes process tools 105, metrology tools 110, process controllers 115, a manufacturing execution system (MES) unit 120, database unit 125, a reticle data warehouse system 130, and a network 135. The various entities in the manufacturing system 100 may be implemented using software components, hardware components, firmware components, and/or a combination thereof.

The network 135 interconnects various components of the manufacturing system 100, allowing them to exchange information. Each of the tools 105, 110 may be coupled to a computer (not shown) for interfacing with the network 135, or a suitable interface may be integrated into the tool 105, 110.

A particular wafer or lot of wafers progresses through the process tools 105 as it is being manufactured, with each tool 105, 140 performing a specific function in the process flow. Exemplary process tools 105 for a semiconductor device fabrication environment include photolithography tools, such as the photolithography tool 140 employing a reticle 145, etch tools, deposition tools, polishing tools, rapid thermal processing tools, implantation tools, etc. An actual implementation of the manufacturing system 100 includes many more process tools 105, 140 than those illustrated in FIG. 1, and typically multiple tools of each type are present. In the area of photolithography many different reticles 145 may be provided. For example, each type of device manufactured typically employs a reticle set of 30–50 reticles. Multiple reticle sets may be employed for a particular device type. Hence, the number of reticles 145 employed in the manufacturing system 100 may number in the hundreds or thousands.

Exemplary metrology tools 110 include film measurement devices, scanning electron microscopes, optical review tools, electrical test tools, etc. Again, an actual implementation includes many metrology tools 110. The metrology tools 110 may measure various parameters associated with the processing of the wafers in the manufacturing system 100, including physical data regarding the processed wafers, such as feature dimensions, process layer thickness, surface profile, etc., or performance data, such as speed, yield, power consumption, etc.

The process controllers 115 determine control actions to control various operations of selected process tools 105 based, at least in part, on metrology data collected by the metrology tools 110 during the fabrication of wafers. The particular control models used by the process controllers 115 depend on the type of process tool 105 being controlled, and the particular metrology data collected for use in conjunction with the control models depends on the feature being formed by the particular process tool 105. The control models may be developed empirically using commonly known linear or non-linear techniques. The control models may be relatively simple equation-based models (e.g., linear, exponential, weighted average, etc.) or more complex models, such as a neural network model, a principal component analysis (PCA) model, or a partial least squares projection to latent structures (PLS) model. The specific implementation of the control models may vary depending on the modeling techniques selected and the process being controlled. The selection and development of the particular control models is within the ability of one of ordinary skill in the art, and accordingly, the control models are not described in greater detail herein for clarity and to avoid obscuring the instant invention.

An exemplary process control scenario involves the control of a gate electrode critical dimension (CD) in a transistor structure. Various processes and process variables may be controlled to affect the gate electrode CD. For example, the reticle 145 may be used in the photolithography tool 140 to pattern a gate electrode. The photolithography processes used to form the mask may affect the dimensions of the pattern and thus the dimensions of the gate electrode formed by an etch process using the mask. Exposure time and energy may be controlled by a process controller 115 to affect the dimensions of the mask. The parameters (e.g., etch time, plasma power, etch gas makeup and concentration, etc.) of the etch process may also affect the CD of the completed gate electrode and may be controlled by a different process controller 115. The processes and variables described above that affect the gate electrode CD are not exhaustive. Other processes may be performed that have an impact of the CD and other variables of those processes may be controlled.

The MES unit 120 directs the high level operation of the manufacturing system 100. The MES unit 120 monitors the status of the various entities in the manufacturing system 100 (i.e., lots, tools 105, 110, 140). The database unit 125 is provided for storing a plurality of types of data, such as manufacturing-related data (e.g., pre-process and post process metrology data), data related to the operation of the system 100 (e.g., the status of the tools 105, 110, 140 the status and priorities of semiconductor wafers 105, etc.). The database unit 125 may store tool state data relating to a plurality of process runs performed by the process tools 105. The database unit 125 may include a database server 150 for storing tool state data and/or other manufacturing data related to processing of wafers into a database storage unit 155.

The MES unit 120 stores information in the database unit 125 related to the particular tools 105, 110, 140 (i.e., or sensors (not shown) associated with the tools 105, 110, 140) used to process each lot of wafers. Sensor data stored for the process tools 105 may include chamber pressure, chamber temperature, anneal time, implant dose, implant energy, plasma energy, processing time, etc. Data associated with the operating recipe settings used by the process tool 105, 140 during the fabrication process may also be stored in the database unit 125. For example, it may not be possible to measure direct values for some process parameters. These settings may be determined from the operating recipe in lieu of actual process data from the process tool 105.

Figure 2:
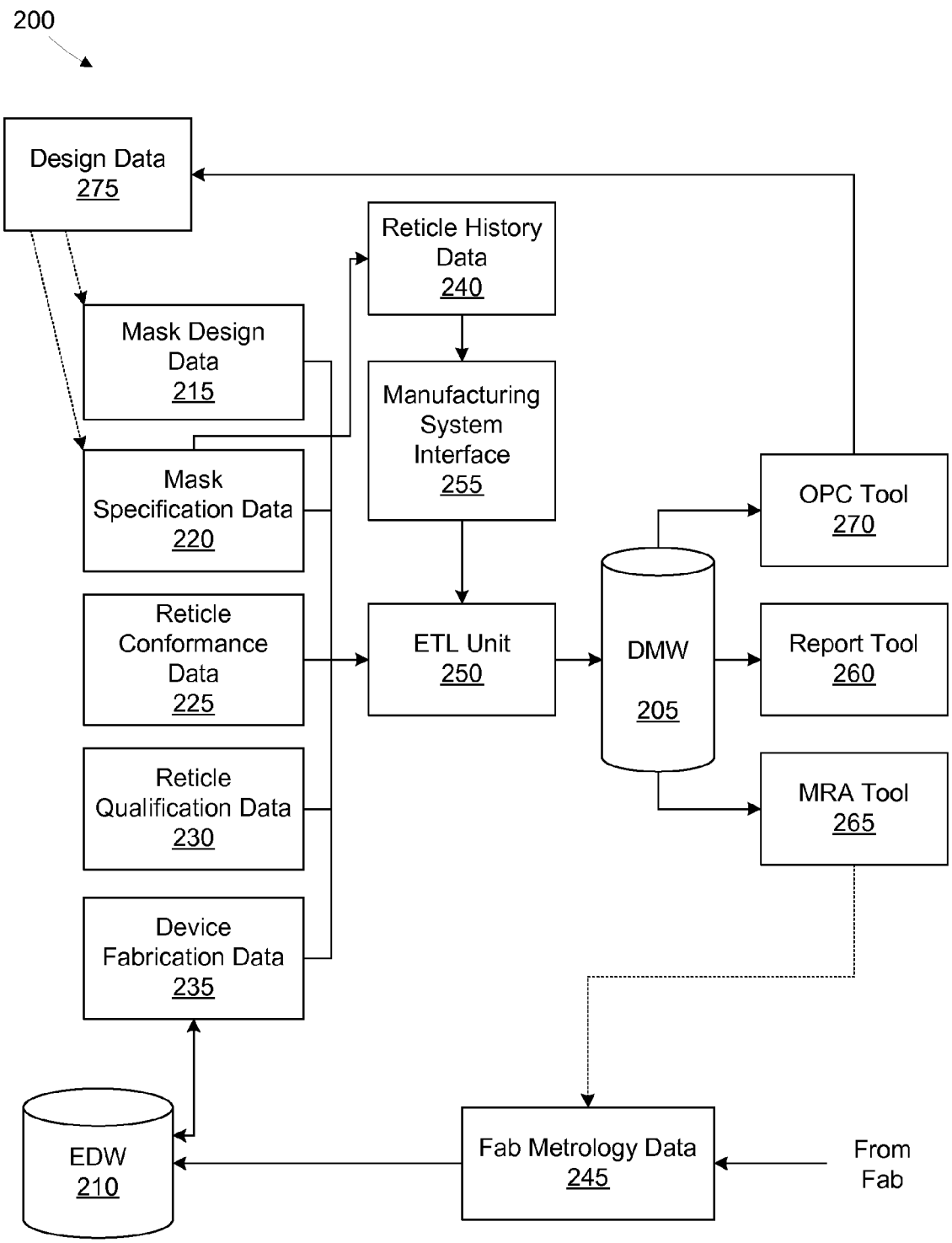
FIG. 2 is a simplified block diagram of the reticle data warehouse system of FIG. 1.

Turning now to FIG. 2, a simplified block diagram of the reticle data warehouse system 130 is shown. The reticle data warehouse system 130 is described using a combination of data files or structures, software applications, and hardware units. These elements may be stored or implemented using a distributed or a centralized architecture depending on the particular implementation. Although the reticle data warehouse system 130 is shown in FIG. 1 as being a separate entity, in some embodiments, the reticle data warehouse system 130 may be integrated into the database unit 125.

The reticle data warehouse system 130 includes a design/mask/wafer (DMW) data warehouse 205 that stores data associated with target features that are defined for the reticles 145 during the design process. Generally, the DMW data warehouse 205 stores data that links reticle design information, qualification information, and device production information for the defined target features. The DMW data warehouse 205 allows data associated with these target features to be linked throughout all phases of a reticle's design, manufacture, and use. The reticle data warehouse system 130 may interface with an engineering data warehouse 210 (typically part of the database unit 125 in FIG. 1) for purposes of accessing production metrology data associated with the target features. The target features may be selected for verifying aspects of the design, and in some cases these features may affect the performance characteristics of the final device. Alternatively, features may be designated as target features simply because the designer desires to track how the feature is implemented in the reticle 145, and ultimately on the device. Data associated with a target feature may be useful for future refinement of the design.

The data sources for the DMW data warehouse 205 include mask design data 215, mask specification data 220, reticle conformance data 225, reticle qualification data 230, device fabrication data 235, and reticle history data 240. The engineering data warehouse 210 stores metrology data collected during the production process, as represented by fab metrology data 245. The device fabrication data 235 and fab metrology data 245 are related in that the device fabrication data 235 is a subset of the fab metrology data 245 that is associated with the reticle target features, as will be described in greater detail below.

The data sources 215–240 stored in the DMW data warehouse 205 may be processed by an extraction/transformation/loading (ETL) unit 250 prior to loading. Generally, the ETL unit 250 includes an extraction front-end tailored to interface with the native format of the associated data sources 215–235. For example, the data sources 215–235 may be formatted a variety of formats including XML, PDF, spreadsheet, postscript, text, etc. In cases where the data to be entered into the DMW data warehouse 205 resides in a different data store, such as the engineering data warehouse 210, the ETL unit 250 may interface with the database and access records to link with the appropriate target features. In other cases, data may come from other processing entities, such as a manufacturing execution system (MES) responsible for controlling the production flow within the fabrication facility. In such as case, a manufacturing system interface 255 may be provided to retrieve or receive data from such an external source. For the example, the manufacturing system interface 255 may receive reticle history data 240 from the MES, as is described in greater detail below.

Figure 3:
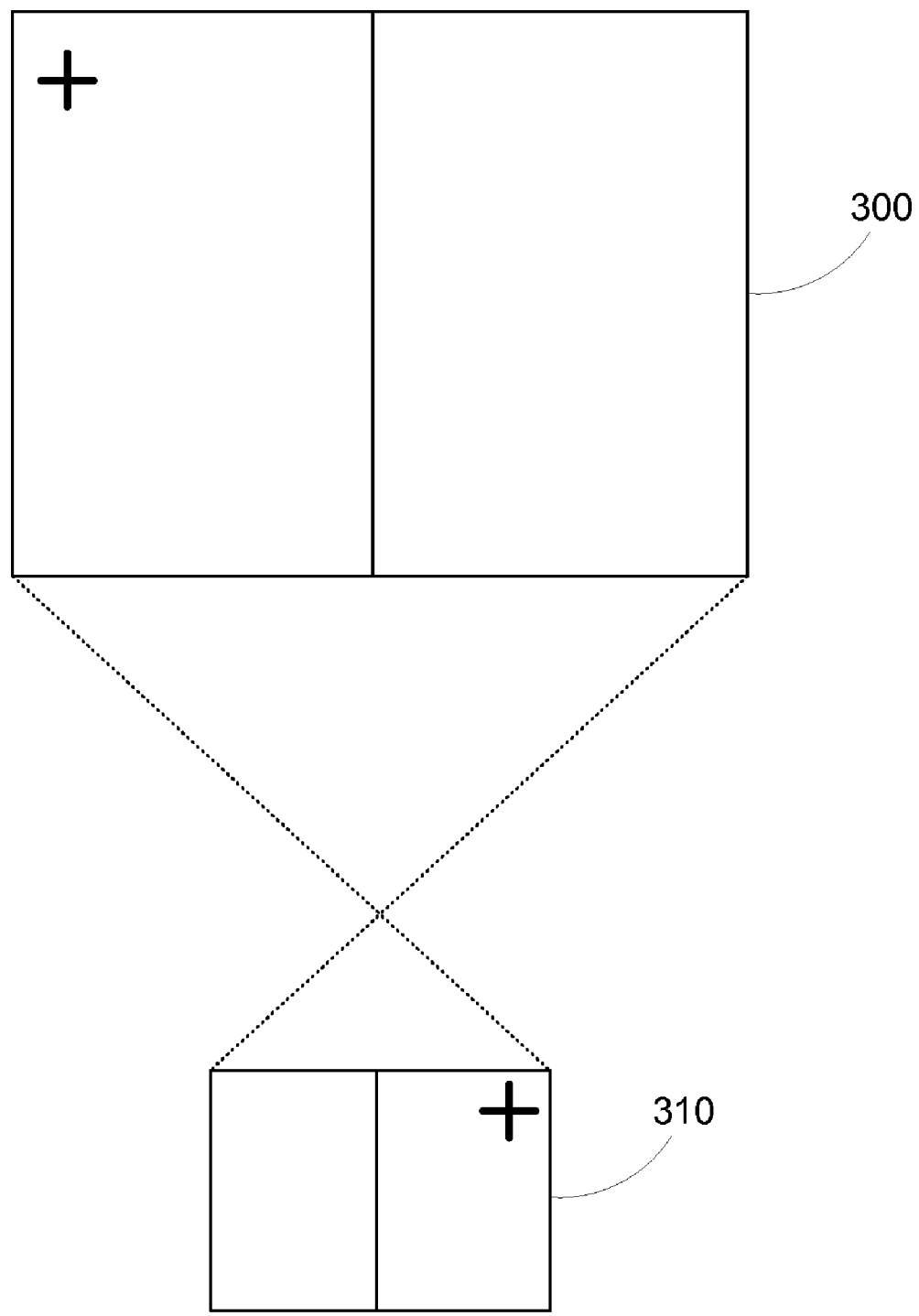
FIG. 3 is a diagram illustration reticle to wafer coordinate transformation.

The ETL unit 250 may also perform transformation activities to change the coordinate system of one of the data sources to allow the data therein to be linked to data from other sources that employ a different coordinate system, as illustrated in FIG. 3. For example, data in the mask specification data 220 and the reticle conformance data 225 may be specified in mask coordinates 300 (e.g., defined from the center of the reticle 145), while the data in the reticle qualification data 230 and the device fabrication data 235 is specified in device coordinates 310 (e.g., which have a different scale and reference point. Typically, to transform from mask coordinates 300 to device coordinates 310, the coordinate system is inverted because the printed image is a mirror image of the pattern defined on the reticle 145, shifted to account for the change in reference point, and scaled to account for the magnification factor of the reticle 145.

Finally, the loading component of the ETL unit 250 stores the extracted and transformed data in the DMW data warehouse 205. The compartmentalized nature of the ETL unit 250 allows the extraction frond-end to be modified to account for a different data source format without affecting the transformation or loading portions.

The data stored in the DMW data warehouse 205 may be used for various purposes. To that end, a report tool 260 may be provided for extracting data for an associated reticle 145 indexed in the DMW data warehouse 205. A metrology request automation (MRA) tool 265 may also be provided to automate the generation of metrology jobs necessary to track the performance of the production devices with respect to the target features. Other particular tools, such as an optical proximity correction (OPC) tool 270 may also be provided for analyzing the DMW data. The information in the DMW data warehouse 205 may be used for improving the design or troubleshooting design related production issues.

Now, the nature of the data stored in the various data sources 215–240 is described in greater detail. However, the specific construct of the data sources and the information contained therein may vary depending on the particular implementation. For example, more or less data in the same category may be included in the various data sources 215–240. The specific examples provided below are intended to serve as exemplary guidelines, and the application of the present invention is not limited to any particular example provided.

The mask design data 215 is generated from design data 275 related to the functional design of the device being manufactured. In the illustrated embodiment, the mask design data 215 contains reticle manufacturing design data, including:

Mask data prep (bar code text, revision, directory, process tech, fab etc.)
Input Graphic Data System (GDS) file (GDS filename, top cell, pattern name, etc.)
Optical proximity correction size (job level, output filename, software version, tech file, etc.)
Fracture data (pattern file name, fracture software version, fracture resolution, fracture bias, etc.)
Reticle codes: (magnification, wave, reticle type, etc.)

The mask specification data 220 includes information provided to reticle manufacturer for specifying the patterns to be defined in the reticle 145, those patterns that are considered to be target features, critical dimensions (CD), CD locations, and acceptance criteria. Typically, the mask specification data 220 is formatted in accordance with an industry standard, such as SEMI-P10 for communication to a reticle manufacturer, Those of ordinary skill in the art are familiar with specifying reticle manufacturing requirements in SEMI-P10 format, so the detailed construct of the mask specification data 220 is not detailed herein. In one embodiment, the mask specification data 220 contains reticle information consisting of order, mask set ID, mask group ID, reticle layer, pattern, pattern group, pattern group placement, CD locations, and other information. General information concerning the reticle 145 may also be specified, such as glass size, glass type, flatness, mask coating, resist type (e.g., positive or negative), etc. Generally, the mask specification data 220 may be formatted using a key/value scheme. The content of the file is structured by data-segment and segments are nested based on their relation. Every data segment of the file has a start and an end tag. Some data segments are nested within another data segment (i.e., there is a hierarchical relation of data across the segment). The mask specification data 220 does not resemble a conventional flat file with a predetermined format that usually has a certain number of records to be processed. Instead, the records may be defined internally using the tag/value format, and the number of lines in the source file does not indicate the number of records to be processed.

The reticle conformance data 225 is data received from a reticle manufacturer with the completed reticle 145 to provide a certificate of conformance (CofC) documenting that the reticle 145 meets the SEMI-P10 requirements specified in the mask specification data 220 that was provided to the manufacturer. The reticle conformance data 225 may include the following major sections:

Vendor Information
Billing Information
Materials Used
Substrate
Coating
Barcode Text, Barcode Type, Barcode Rotation, Mfg Site Used, etc.
Phase Shift Measurements, Transmission Measurements, Phase Angle Measurements.
Lithography Information
Registration Measurements
CD Group Measurements CD Set Results
Defect Measurements
Surface Inspection Measurements The reticle qualification data 230 includes reticle qualification data. This data is generated by the wafer fab as a result of the inspection and tests that are performed when the new reticle 145 is received. The reticle qualification data 230 may include metrology data collected to test the features on the wafer to compare the fabricated features with the features defined in the mask pattern on the reticle 145. Exemplary reticle qualification data includes:

Qualification Inspection Summary
Surface Type
Qualification Inspection Data
Qualification Inspection Sensitivity
Qualification Inspection Category The device fabrication data 235 represents data parsed from the fab metrology data 245 that directly relates to the target features designated in the mask design data 215 and mask specification data 220 as verified by the reticle conformance data 225 and the reticle qualification data 230.

In performing coordinate transformations, the ETL unit 250 or manufacturing system interface 255 may store the transformed coordinates with the associated data. Otherwise, the data from the data sources 215–235 may be linked based on the transformed coordinates without actually storing the transformed coordinates. In linking the items, a coordinate bounding box may be defined in relation to a target feature for associating other data. For example, the mask specification data 220 may define target features at specific points. The associated reticle conformance data 225 coordinates may not precisely match the specific points. In such cases a bounding window (e.g., 10 units×10 units) may be defined around the target feature location to link the reticle conformance data 225 to the target feature data in the mask specification data 220. Likewise, a bounding window for the device data (e.g., reticle qualification data 230 or device fabrication data 235) may also be defined, albeit the bounding window would require adjustment for the particular coordinate transformation.

The reticle history data 240 includes data regarding the history the various reticles 145 employed in the manufacturing system 100. The reticle history data 240 may include manufacturing history data associated with the fabrication or maintenance of the reticle 145 or reticle usage history data associated with the usage of the reticle 145 in the fabrication facility. Exemplary reticle manufacturing history data may include information such as manufacturing schedule (e.g., order data, estimated completion date, actual completion date, etc.), defect data (e.g., location and size), material of construction, magnification factor, periodic inspection results, maintenance cleaning history, etc. Some of the reticle manufacturing history data may be extracted by the ETL unit 250 from one of the other data sources 215–235, such as the reticle conformance data 225.

Exemplary reticle usage history data includes records detailing each use of the reticle 145 that identify the tool (e.g., the photolithography tool 140) that employed the reticle 145, the wafer that was patterned using the reticle 145, one or more exposure operating recipe parameters, etc. Also, the reticle history data may include one or more calculated parameters, such as the number of reticle uses since the last clean, the number of uses since the last inspection, or the total number of uses. Typically, the reticle history data 240 related to reticle usage is received from the MES unit 120 through the manufacturing system interface 255. For example, the MES unit 120 would send a record to the ETL unit 250 through the manufacturing system interface 255 each time a reticle 145 is used, cleaned, or inspected. The reticle usage history information for a processing event would include a reticle ID, tool ID, wafer ID, and designated recipe parameters. The ETL unit 250 stores the reticle usage history information in the DMW data warehouse 205 for the associated reticle 145. Generally, the reticle history data 240 allows each reticle 145 to be tracked as an entity within the manufacturing system.

Figure 4:
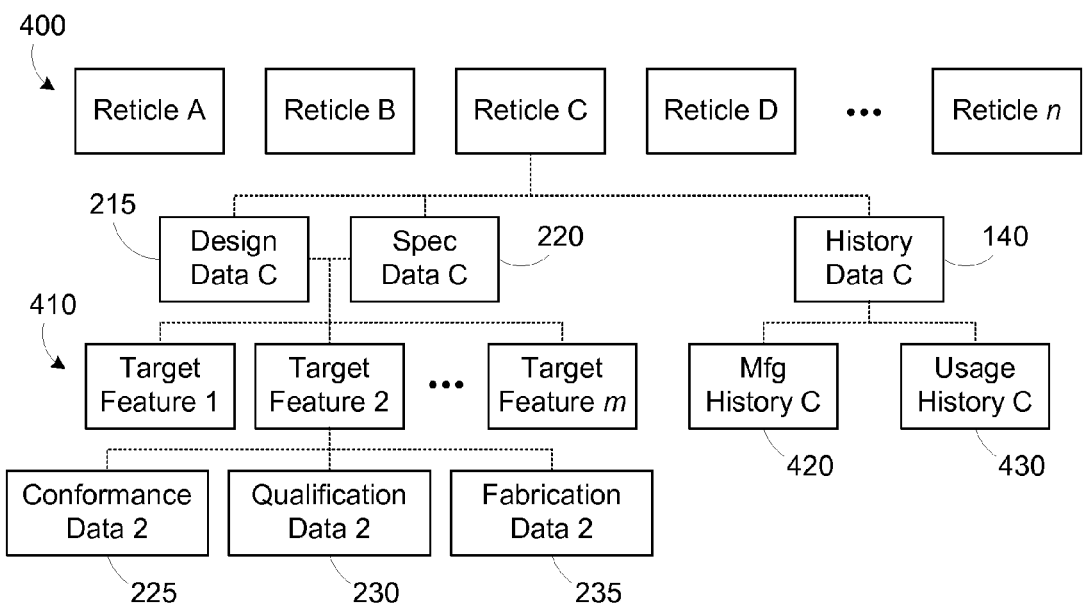
FIG. 4 is a diagram illustrating an exemplary hierarchy for linking data in the DMW data warehouse of FIG. 2.

Turning now to FIG. 4, a diagram illustrating an exemplary hierarchy for linking data in the DMW data warehouse 205 is provided. The diagram is not intended to represent an actual data structure, but rather only to illustrate how the data in the DMW data warehouse 205 may be related and how it may be used. Generally, the DMW data warehouse 205 stores information associated with a plurality of reticles 400 (e.g., Reticle A through n). For each reticle 400, mask design data 215 and mask specification data 220 are stored. The mask design data 215 and/or mask specification data 220 define target features 410 (e.g., Target Features 1 through m). Associated with each target feature 410, reticle conformance data 225, reticle qualification data 230, and device fabrication data 235 are stored. Reticle history data 240 is also maintained for each reticle 400, including manufacturing history data 420 and usage history data 430. As seen in FIG. 4, data stored in the DMW data warehouse 205 allows a comprehensive view of each reticle 400, including data associated with its design, manufacture, and use.

The reticle history data 240 allows various events, such as yield issues, fault conditions, etc. to be analyzed in view of and/or matched to specific reticles. The correlation possible between a specific reticle 400 and device fabrication data 235 associated with the reticle 400 allows reticle trends to be identified. The identification of such trends may be useful in determining inspection, cleaning, or reticle replacement intervals based on historical data or predictive modeling. For example, the MES unit 120 may query the reticle history data 240 to determine a usage count between cleans or inspection, or a total usage count. Based on these counts, the MES unit 120 may automatically schedule preventative maintenance activities, such as cleans, inspections, or reticle replacements. The reticle history data 240 also allows reticle comparisons that allow the performance, durability, quality, or life of reticles from different manufacturers to be determined, for example.

The reticle design and manufacture data is useful for automatically identifying reticle production problems prior to use. The linking provided by the DMW data warehouse 205 for the mask specification data 220, reticle conformance data 225, and reticle qualification data 230, allows the report tool 260 to generate a reticle manufacturing report detailing the target features defined in the mask specification data 220 to the CofC provided by the reticle manufacturer in the reticle conformance data 225. If the conformance data does not match the specification data (e.g., conformance data fails to meet acceptable tolerance—Reticle CD>Target CD, conformance data missing for a target feature, etc.), immediate feedback may be provided to the reticle manufacturer to supply the missing data or remanufacture the reticle. In this manner, reticle defects can be identified and corrected prior to the reticle being placed in service.

Figure 5:
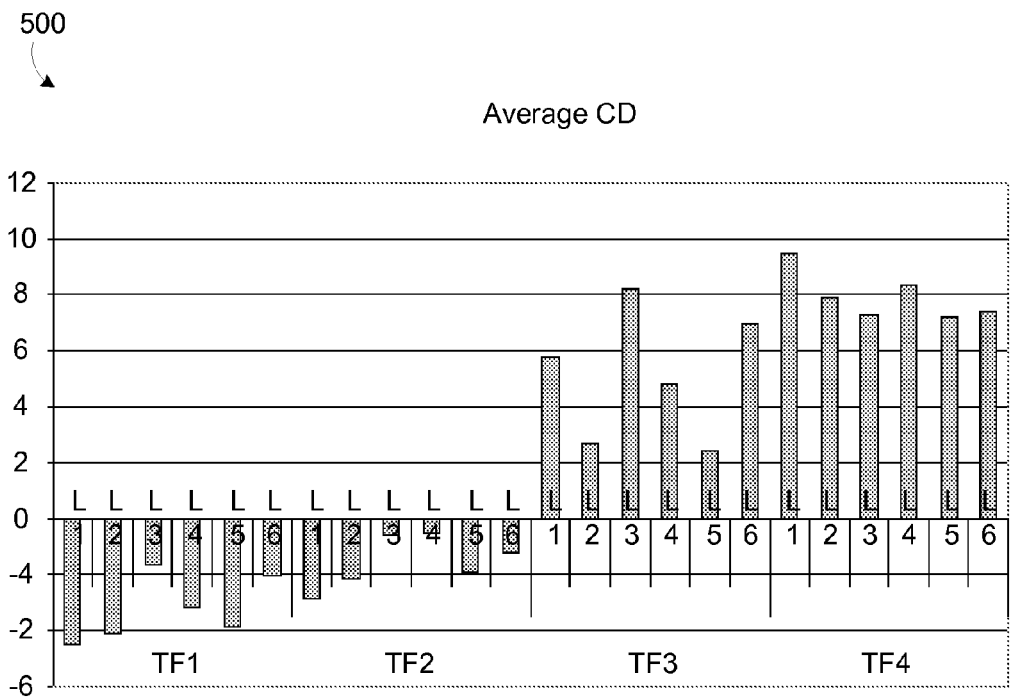
FIG. 5 is an exemplary graph illustrating variation data that may be extracted from the DMW data warehouse of FIG. 2 based on the linking of FIG. 4.

The report tool 260 may be used to extract data from the DMW data warehouse 205 to aid in troubleshooting or design review. For example, to investigate yield issues, the fab metrology data 245 matched to particular reticles may be used to determine if the reticle may be the source of the problem. Turning now to FIG. 5, an exemplary graph 500 illustrating the linking of the data in FIG. 4 is provided. The graph 500 may be generated by the report tool 260, for example. The graph 500 illustrates measurements associated with a plurality of target features at a plurality of locations on each target feature. Data for the graph 500 may be extracted from the mask specification data 220, reticle conformance data 225, reticle qualification data 230, or device fabrication data 235 for a designated reticle 400 and the target features 410 defined for the reticle 400. For example the graph 500 may illustrate deviation from a target CD for the reticle, deviation from target CD for features formed using the reticle 400, a difference between the reticle CD and the device CD (after transformation of at least on of the measurements), or some combination of these metrics displayed on a common axis (i.e., converted to a common coordinate frame).

In a production of a semiconductor device, there are various sources of variation. One source of CD variation is the process used to form the feature. For example, in the photolithography tool 140, recipe settings such as focus and exposure dose may be determined by the process controller 115 based on measured feedback to automatically control the CD of the device features. The ability to make effective control decisions depends on accurately identifying the source of variation. The data in the DMW data warehouse 205 may be used to identify the source of variation. Because the reticle history data 240 indicates the individual reticles used to process a wafer, the production metrology data may be linked to the precise features on the reticle 145 that was used to form the device feature.

For example, a report may be generated for a selected reticle that matches the device fabrication data 235 with the reticle conformance data 225 and/or reticle qualification data 230 for the reticle 145. By linking the data based on particular metrology sites, it may become apparent that the observed variation at one or more of the sites is due to reticle variation rather than process variation. Based on this analysis, the aggressiveness of the control technique employed by the process controller 115 may be adjusted. Also, the measurement sites used to generate feedback metrology data for input to the process controller 115 may be changed to sites having a more uniform reticle CD. Subsequent observed variation would then more likely be a result of process variation rather than reticle variation.

The data illustrated in FIG. 3 is also useful for generating metrology plans to allow engineers to select consistent metrology sites. Metrology data collected at consistent sites facilitate correlation of actual production data with design data. This correlation aids in validating design concepts, allowing the creation of designs product designs that can be manufactured to a higher yield. Consistency in metrology sites also provides better data quality, more efficient data collection, and a reduction in the number of metrology steps and sites, thereby decreasing manufacturing cycle time and cost.

To aid in generating a metrology plan, the MRA tool 265 (see FIG. 2) accesses the DMW data warehouse 205 responsive to a user request to identify sampling locations for a particular metrology step in the production flow. For example, to plan metrology for a particular layer, the user may select a particular device layer. The layer may be matched to the associated reticle or reticles capable of patterning the layer. There may be more than one reticle capable of patterning the selected layer, but each should have the same designated target features. The user may then select from the target features, and the MRA tool 265 may perform any necessary transformations to generate corresponding sites for the metrology plan. The use of the metrology plan so generated will provide additional data for the DMW data warehouse 205 that can be directly linked to the target features of the reticles. As seen in FIG. 2, the MRA tool 265 is used in a feedforward manner to drive the generation of fab metrology data 245 that can be linked as device fabrication data 235 in the DMW data warehouse 205. This targeted metrology data is useful for design review and improvement, as well as for process control of the manufacturing system 100.

Other design feedback information may also be generated by the OPC tool 270. Certain reticle features may be designated as target features because the subsequent metrology data collected at the corresponding device sites may be useful for gauging that efficacy of the optical proximity correction (OPC) techniques applied to the design. Optimal proximity effects arise due to the small size of the device features and the inherent limitations of the imaging system (e.g., the wavelength of the incident exposure radiation). OPC is the process of modifying the shapes of the features in the design to compensate for the non-ideal properties of the photolithography process. Given the shapes desired on the wafer, the mask is modified to improve the reproduction of the critical geometry. By associating device metrology data to the target features on the reticle, the efficacy of the OPC techniques may be determined. Subsequently, the OPC design modifications may be altered to improve a given design or incorporated into a new design.

The reticle data warehouse system described herein enables the tracking of each reticle employed in a semiconductor manufacturing system and allows a comprehensive view of data associated with the reticles to be generated. This expansive view encompasses data associated with its design, manufacture, and use, and is useful for identifying reticle manufacturing issues, identifying device production issues, planning reticle maintenance activities, and determining overall reticle quality.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A reticle information system, comprising:
   a reticle database operable to store data associated with a plurality of reticles; and
   a loader operable to receive reticle usage history information specifying a selected reticle, a tool, and at least one wafer processed in the tool using the selected reticle, link the reticle usage history information to the selected reticle, and store the linked reticle usage history information in the reticle database.

2. The system of claim 1, wherein the reticle usage information further specifies at least one operating recipe parameter employed by the tool to process the at least one wafer using the selected reticle.

3. The system of claim 1, further comprising:
   a manufacturing execution system unit operable to manage operation of tools in a process flow and provide the reticle usage information to the loader responsive to a completion of a process event associated with the tool.

4. The system of claim 1, wherein the reticle usage history information includes reticle maintenance information.

5. The system of claim 4, further comprising:
a manufacturing execution system unit operable to manage operation of tools in a process flow and provide the reticle maintenance information to the loader responsive to a completion of a maintenance event associated with the selected reticle.

6. The system of claim 5, wherein the maintenance event comprises at least one of a reticle clean event and a reticle inspection event.

7. The system of claim 4, further comprising:
a manufacturing execution system unit operable to schedule a preventative maintenance activity for the selected reticle based on the reticle usage information and the reticle maintenance information.

8. The system of claim 1, wherein the reticle usage history information further comprises reticle manufacturing history information.

9. The system of claim 1, further comprising:
an engineering database operable to store metrology data associated with devices manufactured in a process flow; and
a manufacturing execution system unit operable to manage operation of tools in the process flow and provide reticle usage information to the loader responsive to a completion of a process event in the process flow,
wherein the loader is operable to link the metrology data to individual reticles in the plurality of reticles based on the reticle usage information.

10. The system of claim 9, wherein the reticle database is operable to store design data associated with each of the plurality of reticles, the reticle design data for each reticle specifying target features on the associated reticle, and the loader is further operable to link the metrology data to the target features.

11. The system of claim 10, wherein the loader is operable to link the metrology data based on the specified wafer and selected reticle.

12. The system of claim 9, wherein the metrology data comprises yield data.

13. A method, comprising:
storing data associated with a plurality of reticles;
receiving reticle usage history information specifying a selected reticle, a tool, and at least one wafer processed in the tool using the selected reticle;
linking the reticle usage history information to the selected reticle; and
storing the linked reticle history information.

14. The method of claim 13, wherein the reticle usage information further specifies at least one operating recipe parameter employed by the tool to process the at least one wafer using the selected reticle.

15. The method of claim 13, further comprising generating the reticle usage information responsive to a completion of a process event associated with the tool.

16. The method of claim 13, wherein the reticle usage history information includes reticle maintenance information.

17. The method of claim 16, further comprising generating the reticle maintenance information responsive to a completion of a maintenance event associated with the selected reticle.

18. The method of claim 17, wherein the maintenance event comprises at least one of a reticle clean event and a reticle inspection event.

19. The method of claim 16, further comprising scheduling a preventative maintenance activity for the selected reticle based on the reticle usage information and the reticle maintenance information.

20. The method of claim 13, wherein the reticle history information further comprises reticle manufacturing history information.

21. The method of claim 13, further comprising:
storing metrology data associated with devices manufactured in a process flow; and
receiving reticle usage information responsive to a completion of a process event in the process flow,
linking the metrology data to individual reticles in the plurality of reticles based on the reticle usage information.

22. The method of claim 21, further comprising:
storing design data associated with each of the plurality of reticles, the reticle design data for each reticle specifying target features on the associated reticle; and
linking the metrology data to the target features.

23. The method of claim 22, further comprising linking the metrology data based on the specified wafer and selected reticle.

24. The method of claim 21, wherein the metrology data comprises yield data.

25. A system, comprising:
means for storing data associated with a plurality of reticles;
means for receiving reticle usage history information specifying a selected reticle, a tool, and at least one wafer processed in the tool using the selected reticle;
means for linking the reticle usage history information to the selected reticle; and
means for storing the linked reticle history information.

* * * * *